United States Patent [19]

Kumazawa et al.

[11] Patent Number: 5,218,364
[45] Date of Patent: Jun. 8, 1993

[54] D/A CONVERTER WITH VARIABLE BIASING RESISTOR

[75] Inventors: Naoki Kumazawa; Noriyuki Fukushima, both of Kanagawa, Japan

[73] Assignee: Sony Corporation, Tokyo, Japan

[21] Appl. No.: 727,931

[22] Filed: Jul. 10, 1991

[30] Foreign Application Priority Data

Jul. 11, 1990 [JP] Japan .................................. 2-181653

[51] Int. Cl.$^5$ ............................................ H03M 1/78
[52] U.S. Cl. .................................... 341/136; 341/154
[58] Field of Search ................. 341/136, 144, 154, 118

[56] References Cited
U.S. PATENT DOCUMENTS

| Re. 29,619 | 4/1978 | Pastoriza | 341/154 X |
|---|---|---|---|
| 4,331,892 | 5/1982 | Miskin et al. | 341/136 X |
| 4,408,094 | 10/1983 | Oura | 341/144 X |
| 4,827,260 | 5/1989 | Sugawa et al. | 341/144 X |
| 5,055,844 | 10/1991 | Kasai | 341/144 |

Primary Examiner—Sharon D. Logan
Attorney, Agent, or Firm—Hill, Steadman & Simpson

[57] ABSTRACT

A D/A converter comprises a bias circuit including a series circuit of a drain-source of a bias FET and a bias resistor connected between a power source terminal and a reference potential point, the bias circuit includes a negative feedback amplifier to which a reference voltage is supplied, a digital to analog converting section includes a plurality of constant-current source FETs having a current value substantially equal to the current value of the bias FET of the bias circuit, and includes a plurality of current switches for selectively supplying currents of the constant-current source FETs to an output terminal in response to a digital input signal. An output resistor with resistance value Ro is connected to the output terminal to produce an analog output voltage across the output resistor and the resistance of the bias resistor is varied so as to adjust the full scale voltage across the output resistor while maintaining the relationship that the resistance value of the bias resistor is selected by $(2^{n-1})$Ro such that the full scale value of the output voltage is substantially equal to the reference voltage.

2 Claims, 5 Drawing Sheets

D/A CONVERTER WITH VARIABLE BIASING RESISTOR

FIELD OF THE INVENTION

This invention relates to a D/A (digital to analog) converter, and more particularly to a D/A converter with which a maximum amplitude value (full scale value) of an output signal can be set accurately and which is suitable for use with a digital apparatus.

DESCRIPTION OF THE PRIOR ART

A current adding type D/A converter is conventionally known and disclosed, for example, in Japanese Patent Laid-Open Application No. 61-20434.

An exemplary conventional D/A converters of the type mentioned is shown in FIG. 1. Referring to FIG. 1, the D/A converter shown includes an input circuit 1 for receiving a digital signal of three high order bits $N_{11}$ to $N_{13}$, a decoder 2 connected to outputs of the input circuit 1, a flip-flop set 3 including a plurality of flip-flops connected to outputs of the decoder 2, and a constant-current source set 4 including a plurality of constant-current sources connected to outputs of the flip-flops of the flip-flop set 3. The D/A converter further includes another input circuit 5 for receiving a digital signal of five low order bits $M_{11}$ to $M_{15}$, another flip-flop set 6 including a plurality of flip-flops connected to outputs of the input circuit 5, and another constant-current source set 7 including a plurality of constant-current sources connected to outputs of the flip-flops of the flip-flop set 6. Switch circuits are provided for the constant-current source set 4 and the constant-current source set 7 and controlled in response to an input digital signal to produce an analog signal corresponding to opening and closing conditions of the switch circuits.

As such constant-current source set 4 for high order bits, a constant-current source circuit is already known which employs such an FET (field effect transistor) for a constant-current source as shown in FIG. 2 in which also an exemplary one of conventional bias circuits is shown.

Referring to FIG. 2, the constant-current source set includes a plurality of FETs $Q_{N1}$ to $Q_{N7}$ for a constant-current source, and a bias circuit 8. The bias circuit 8 includes a negative feedback amplifier $8a$ for receiving a reference voltage Vref at a same phase input terminal thereof, and a bias FET $Q_A$ and a buffer FET $Q_B$. The buffer FET $Q_B$ and the constant-current source FETs $Q_{N1}$ to $Q_{N7}$ are set such that an equal current Io flows therethrough.

The constant-current source circuit shown in FIG. 2, however, is disadvantageous in that, while the electric current Io flowing through the source of the buffer FET $Q_B$ is stabilized against a temperature variation and so forth by the negative feedback amplifier $8a$, the electric current Io may not be equal among the bias FET $Q_A$ and the constant-current source FETs $Q_{N1}$ to $Q_{N7}$ because of a possible dispersion among elements of them.

Further, such conventional bias circuit has another drawback that a maximum amplitude value (full scale value) of an output signal cannot be set accurately.

SUMMARY OF THE INVENTION

Accordingly, it is an object of the present invention to provide a digital to analog converter wherein an equal current flows through a bias FET and constant-current source FETs.

It is another object of the present invention to provide a digital to analog converter with which a maximum amplitude value (full scale value) of an output signal of a bias circuit can be set accurately.

In order to attain the objects, according to the present invention, there is provided a digital to analog converter which comprises a bias circuit including a series circuit of the drain-source of a bias FET and a bias resistor connected between a power source terminal and a reference potential point, the bias circuit further including a negative feedback amplifier having a same phase input terminal to which a reference voltage is supplied and an inverted phase input terminal connected to a junction between the source of the bias FET and the bias resistor, the negative feedback amplifier further having an output terminal connected to the gate of the bias FET, and a digital to analog converting section including a plurality of constant-current source FETs having a current value substantially equal to the current value of the bias FET of the bias circuit, the digital to analog converting section further including a plurality of current switches for selectively supplying currents of the constant-current source FETs to an output terminal in response to a digital input signal.

With the digital to analog converter, as the gate of the bias FET is controlled in response to an output of the negative feedback amplifier, the amplitude value of the output terminal can be controlled accurately against a possible dispersion among elements of the bias FET and the constant-current source FETs of the digital to analog converting section.

Preferably, the digital to analog converter further comprises a load resistor connected to the output terminal to produce an analog output voltage across the load resistor, and the resistance value of the bias resistor being set to $2^n-1$ times the resistance value of the load resistor so as to make the full scale voltage at the output terminal substantially equal to the reference voltage, n being a number of bits of the digital input signal. Thus, the maximum amplitude value (full scale value) of an output signal can be set accurately.

The above and other objects, features and advantages of the present invention will become apparent from the following description and the appended claims, taken in conjunction with the accompanying drawings in which like parts or elements are denoted by like reference characters.

DESCRIPTION OF THE PREFERRED EMBODIMENT

Figure 1:
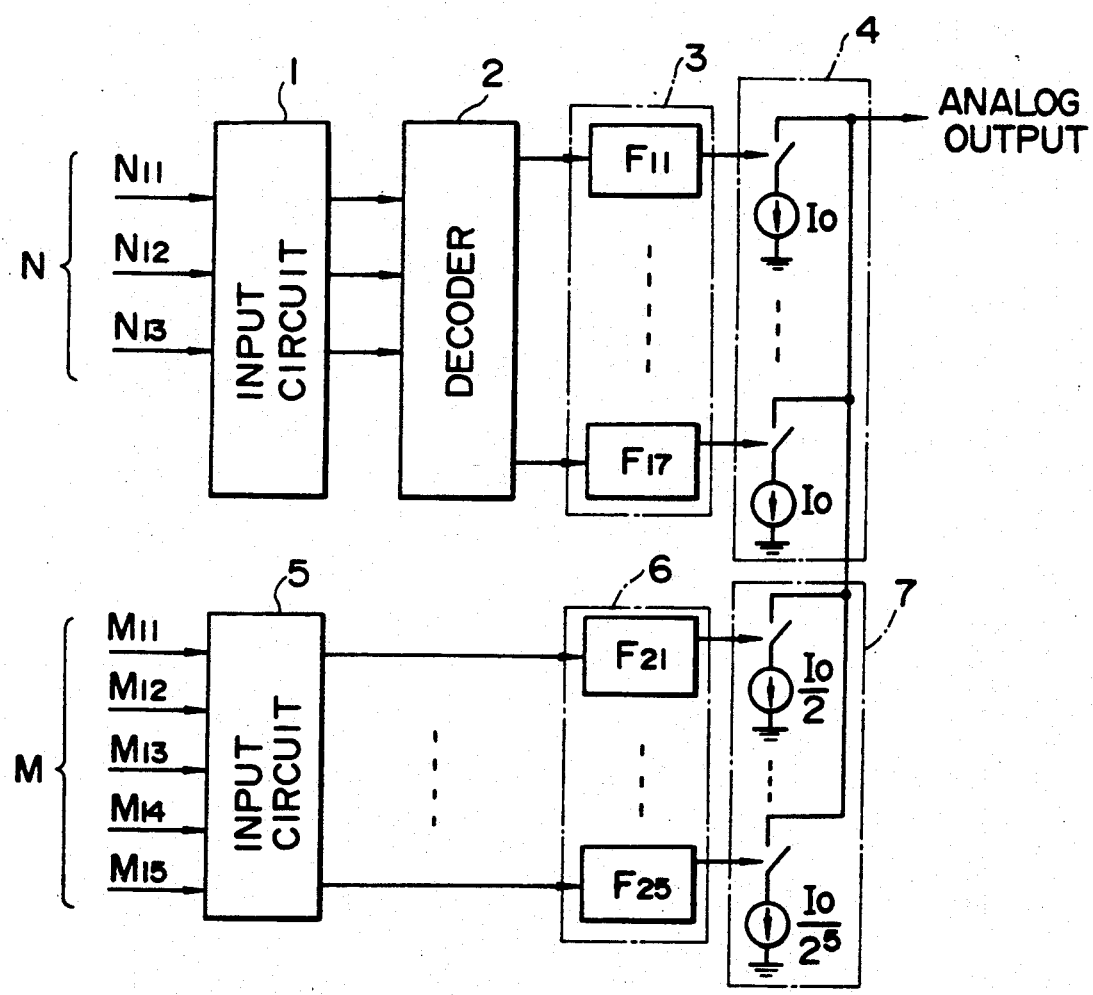
FIG. 1 is a block diagram showing an exemplary one of conventional D/A converters.
Figure 2:
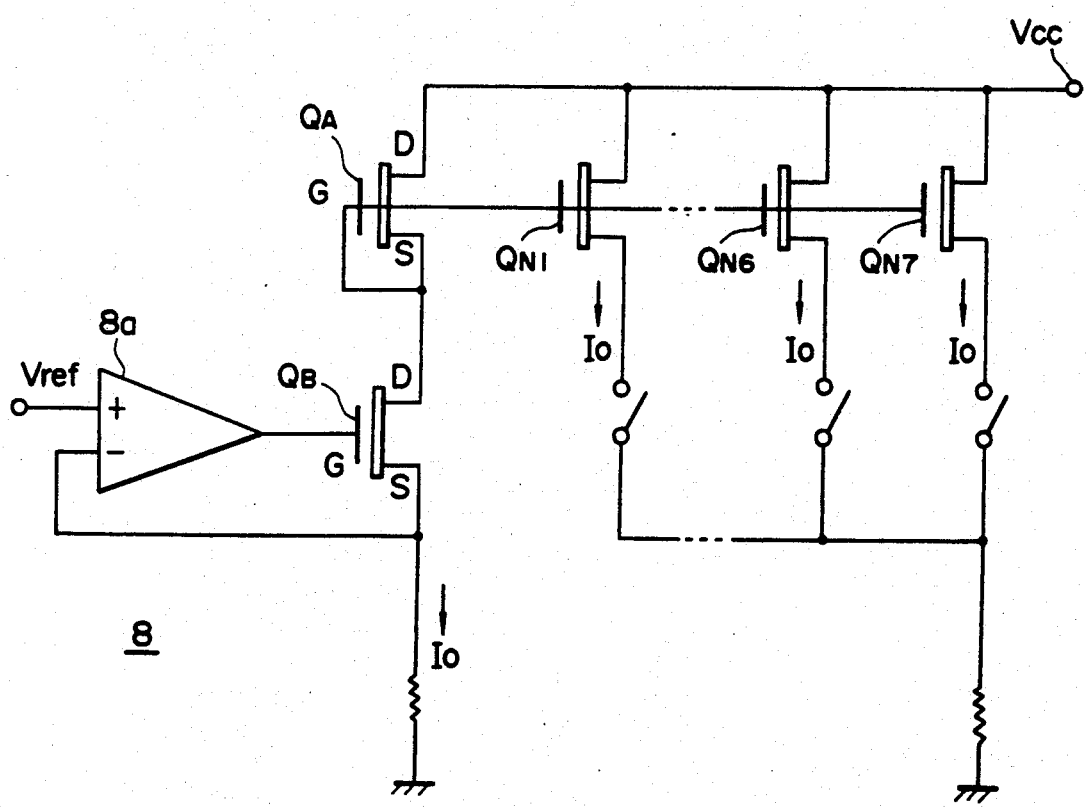
FIG. 2 is a circuit diagram showing an exemplary one of conventional bias circuits.
Figure 3:
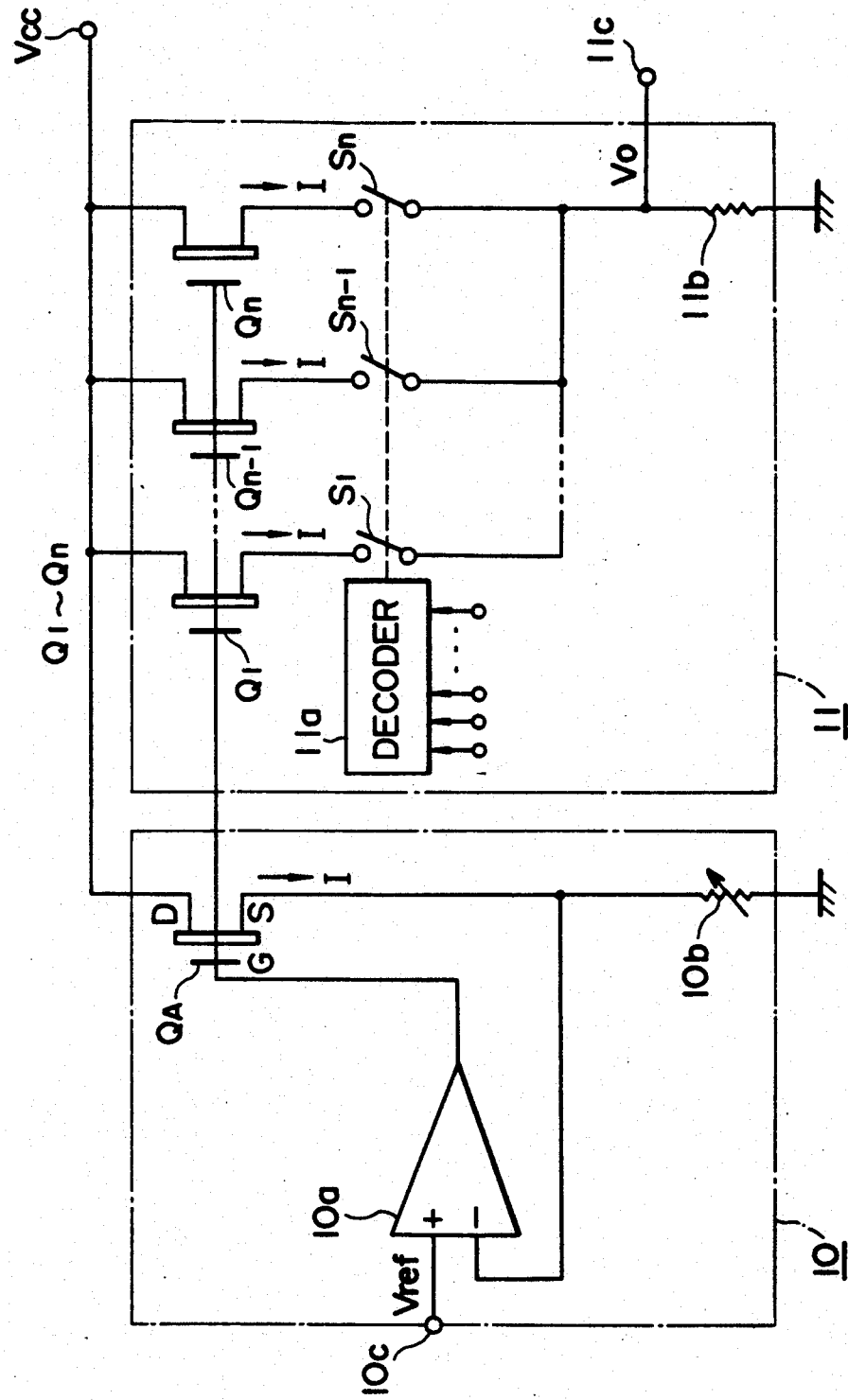
FIG. 3 is a circuit diagram showing basic construction of a D/A converter according to the present invention.

Referring first to FIG. 3, there is shown basic construction of D/A converter according to the present invention. The D/A converter shown includes a bias circuit 10 and a D/A converting section 11. The bias circuit 10 includes a series circuit of the drain-source of a bias FET $Q_A$ and a bias resistor 10b connected between a power source terminal Vcc and a reference potential point (for example, of the ground potential), and a negative feedback amplifier 10a having the same phase input terminal 10c to which a reference voltage Vref is supplied, an inverted phase input terminal connected to a junction between the source (S) of the bias FET $Q_A$ and the bias resistor 10b, and an output terminal connected to the gate (G) of the bias FET $Q_A$. The D/A converting section 11 includes a plurality of FETs $Q_1$ to $Q_n$ for a constant-current source having the gates connected commonly to the gate G of the bias FET $Q_A$. The sources of the constant-current source FETs $Q_1$ to $Q_n$ are connected to an output resistor 11b by way of a corresponding plurality of current switches $S_1$ to $S_n$ which are controlled in response to outputs of a decoder 11a, and an output terminal 11c is led out from a junction between the output resistor 11b and the current switches $S_1$ to $S_n$.

Figure 4:
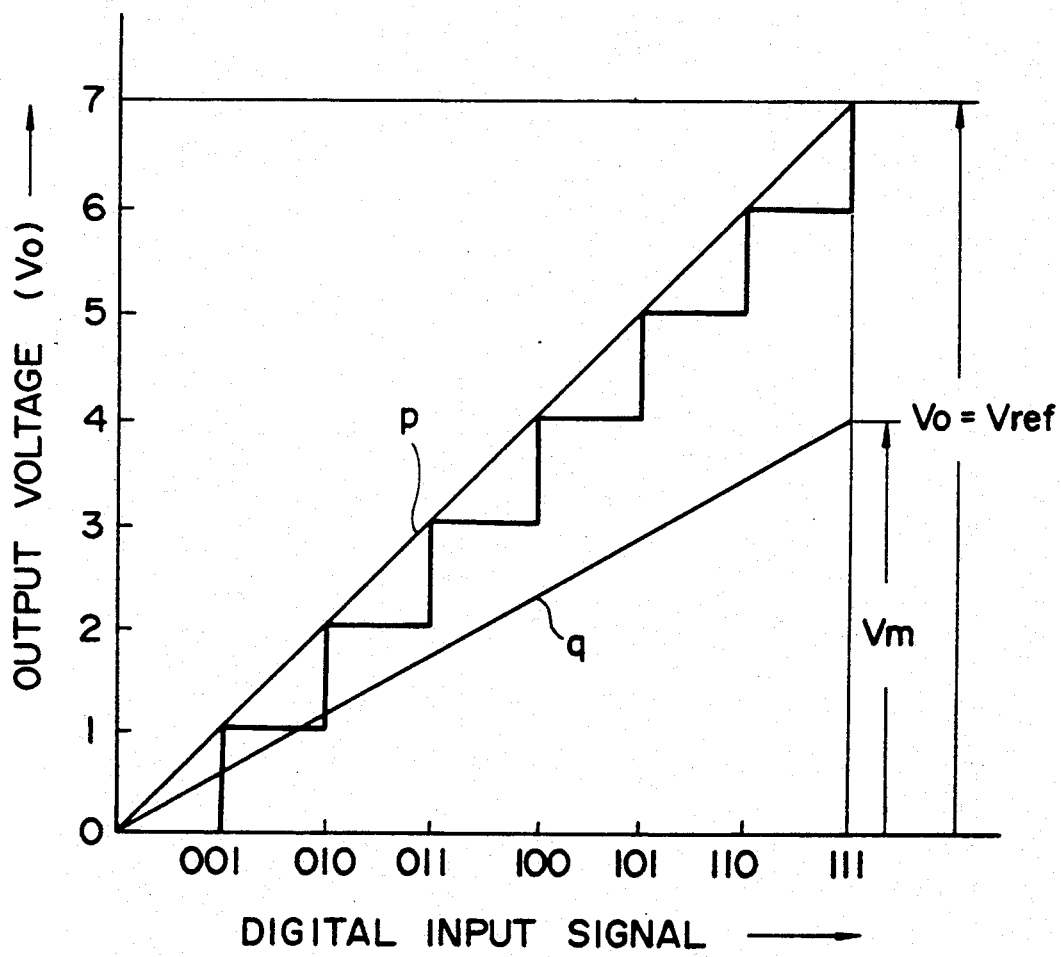
FIG. 4 is a diagram illustrating a conversion characteristic of the D/A converter shown in FIG. 3.

In the D/A converter of the construction described above, since the gates-sources of the bias FET $Q_A$ and the constant-current source FETs $Q_1$ to $Q_n$ are connected in parallel to each other, they have a similar current characteristic and the potentials at the gate and the source of the bias FET $Q_A$ are made equal to the reference voltage Vref due to a feeding back operation of the negative feedback amplifier 10a. Further, a possible dispersion among elements of the bias FET $Q_A$ and the constant-current source FETs $Q_1$ to $Q_n$ can be minimized where they are constructed in a single chip as an integrated circuit. Then, with the D/A converter, as seen from a characteristic curve p shown in a diagram of FIG. 4, the current switches $S_1$ to $S_n$ are controlled in response to a digital input signal (which consists of 3 bits in FIG. 4) to a decoder 11a so that an output voltage Vo corresponding to the digital input signal may be outputted from the output terminal 11c.

Figure 5:
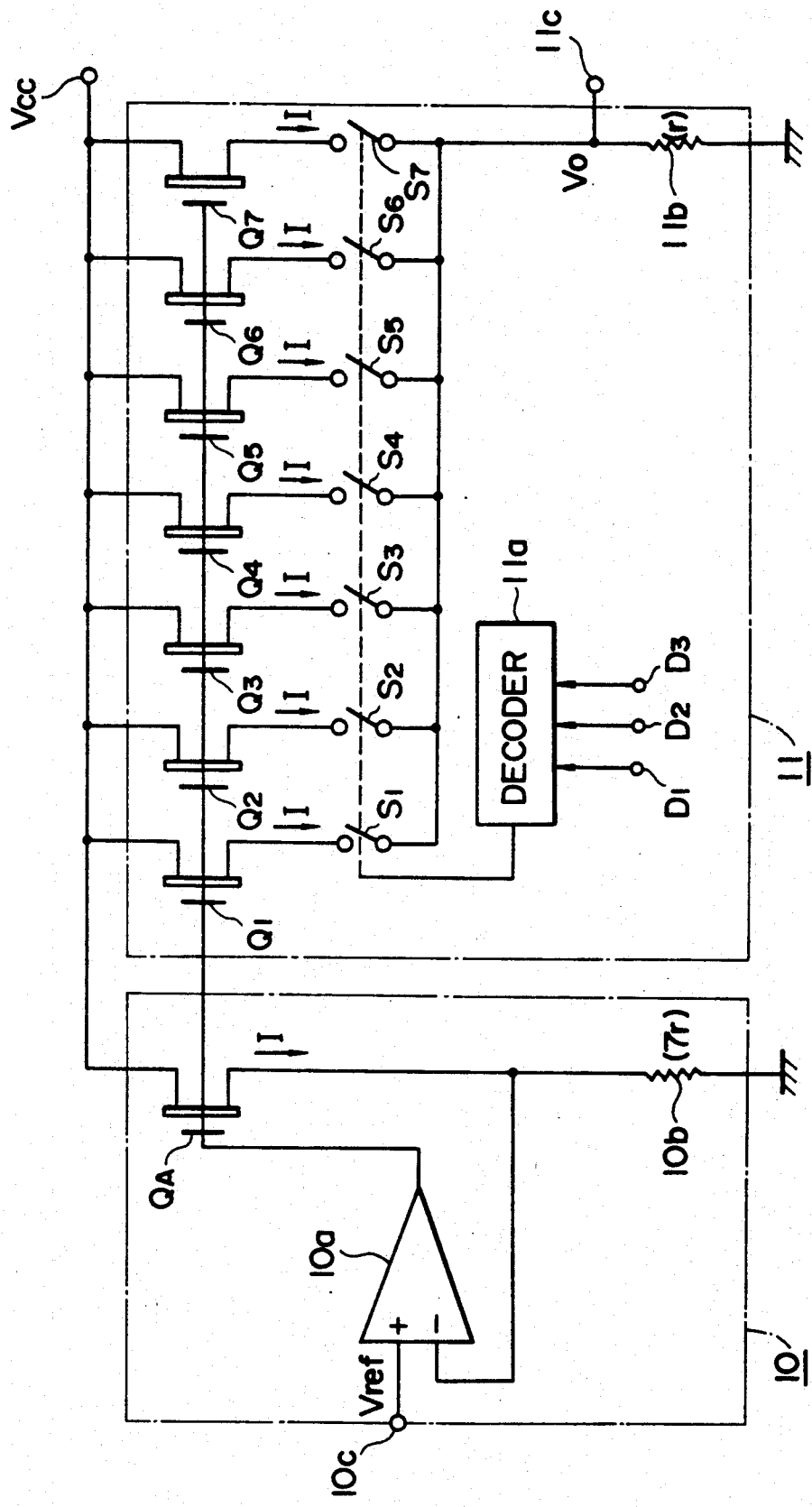
FIG. 5 is a circuit diagram of a D/A converter showing a preferred embodiment of the present invention.

Referring now to FIG. 5, there is shown in circuit diagram a D/A converter according to an embodiment of the present invention. The D/A converter shown has a generally similar construction to the D/A converter shown in FIG. 3 but is constituted such that a digital input signal of three bits D1, D2 and D3 is supplied to the decoder 11a and the resistance value of the bias resistor 10b is set to seven times the resistance value r of the output resistor 11b.

When all of the bits D1, D2 and D3 of a digital input signal are equal to 1, the output voltage Vo from the output terminal 11c is given by Vo=7Ir and accordingly is equal to the reference voltage Vref.

Thus, since the full scale value of the output voltage Vo from the output terminal 11c is equal to the reference voltage Vref when all of the bits D1, D2 and D3 of a digital input signal are equal to 1, setting of an output amplitude can be performed accurately.

In other words, where the number of bits of a digital input signal is represented by n, if the resistance value of the bias resistor 10b is set to $2^n-1$ times the resistance value of the output resistor 11b, then the full scale value at the output terminal 11c can be made accurately equal to the reference voltage Vref.

Further, the reference voltage Vref can be selected if a variable resistor is employed as the bias resistor 10b so as to make the resistance value variable. Thus, a suitable reference voltage which is supplied, for example, to another IC (integrated circuit) can be used commonly for the reference voltage Vref. In this instance, the full scale value of the output voltage Vo from the output terminal 11c is compressed to Vm as seen from a characteristic curve q shown in FIG. 4.

As apparent from the foregoing description, with a digital to analog converter, as the gate of a bias FET is controlled in response to an output of a negative feedback amplifier, the amplitude value of an output terminal can be controlled accurately against a possible dispersion among elements of the bias FET and constant-current source FETs of a digital to analog converting section.

Further, as a load resistor is connected to the output terminal to produce an analog output voltage across the load resistor and the resistance value of a bias resistor is set to $2^n-1$ times the resistance value of the load resistor so as to make the full scale voltage at the output terminal substantially equal to a reference voltage, n being a number of bits of the digital input signal, the maximum amplitude value (full scale value) of an output signal can be set accurately.

Having now fully described the invention, it will be apparent to one of ordinary skill in the art that many changes and modifications can be made thereto without departing from the spirit and scope of the invention as set forth herein.

What is claimed is:

1. A D/A converter comprising:
a biasing circuit consisting of a biasing FET having gate, source and drain, the drain being connected to a DC voltage terminal;
a negative feedback amplifier having an in-phase input terminal, an opposite-phase input terminal supplied with a reference voltage and an output terminal; and a biasing resistor;
a D/A converter circuit consisting of a plurality of current control transistors, each operating as a constant current source with the gates and drains of said plurality of transistors connected to the gate and drain of said biasing FET;
a plurality of current switches connected to the source of said plurality of transistors; and a decoder for supplying switching control signals to said plurality of current switches; an output register connected to said plurality of current switches, an output terminal connected to said output register;
the output terminal of said negative feedback amplifier being connected to the gate of said biasing FET, the source of said biasing FET is connected to a reference point through said biasing resistor and the connection point of said biasing resistor with the source of said biasing FET being connected to the opposite-phase input terminal of said feedback amplifier so as to provide a negative feedback loop; in which the resistance value of said biasing resistor is varied so as to adjust the full scale voltage across said output register while maintaining the relationship that the resistance value of said biasing resistor is selected by $(2^{n-1})$ Ro such that the full scale value of the output voltage is substantially equal to the reference voltage, in which n is the bit number of a digital signal supplied to said decoder and Ro is the resistance value of said output resistor.

2. A digital to analog converter according to claim 1, wherein said bias FET, negative feedback amplifier, constant-current source FETs and current switches are constructed as a single chip integrated circuit.

* * * * *